United States Patent [19]

Taka et al.

[11] Patent Number: 4,717,682
[45] Date of Patent: Jan. 5, 1988

[54] METHOD OF MANUFACTURING A SEMICONDUCTOR DEVICE WITH CONDUCTIVE TRENCH SIDEWALLS

[75] Inventors: Shin-ichi Taka; Jiro Ohshima, both of Kawasaki; Masahiro Abe, Yokohama; Masaharu Aoyama, Fujisawa, all of Japan

[73] Assignee: Kabushiki Kaisha Toshiba, Kawasaki, Japan

[21] Appl. No.: 830,928

[22] Filed: Feb. 19, 1986

[30] Foreign Application Priority Data

Feb. 20, 1985 [JP] Japan .................................. 60-30576

[51] Int. Cl.⁴ .......................................... H01L 21/283
[52] U.S. Cl. .......................................... 437/31; 437/67; 437/233; 437/203; 357/34; 357/59
[58] Field of Search ............... 29/591; 357/22 K, 68, 357/59 K, 59 H, 59 I, 34; 156/657, 653, 643

[56] References Cited

U.S. PATENT DOCUMENTS

| | | | |
|---|---|---|---|
| 3,947,299 | 5/1976 | Weijland et al. | 357/59 H |
| 4,140,558 | 2/1979 | Murphy et al. | 148/175 |
| 4,322,883 | 4/1982 | Abbas et al. | 357/59 H |
| 4,383,883 | 5/1983 | Mizutani | 148/1.5 |
| 4,459,325 | 7/1984 | Nozawa et al. | 148/175 |
| 4,488,162 | 12/1984 | Jambotkar | 357/68 |
| 4,507,853 | 4/1985 | McDavid | 357/68 |
| 4,508,579 | 4/1985 | Gath et al. | 357/59 H |
| 4,549,927 | 10/1985 | Gath et al. | 29/576 W |
| 4,589,193 | 5/1986 | Gath et al. | 29/578 |
| 4,619,037 | 10/1986 | Taguchi et al. | 29/591 |

Primary Examiner—Brian E. Hearn
Assistant Examiner—Kevin McAndrews
Attorney, Agent, or Firm—Finnegan, Henderson, Farabow, Garrett & Dunner

[57] ABSTRACT

A method of manufacturing a semiconductor device, comprising the steps of sequentially forming a buried region and an epitaxial layer on a major surface of a semiconductor substrate, forming a conductive layer along an annular trench extending to the buried region, filling the annular trench with an insulating material and forming a functional element in said epitaxial layer surrounded by said buried region and said insulating material within said annular trench. In this method, the step of forming the conductive layer along the annular trench is carried out by the steps of forming an annular trench extending through said buried region, and depositing a conductive layer on only a side wall surface of said annular trench.

5 Claims, 14 Drawing Figures

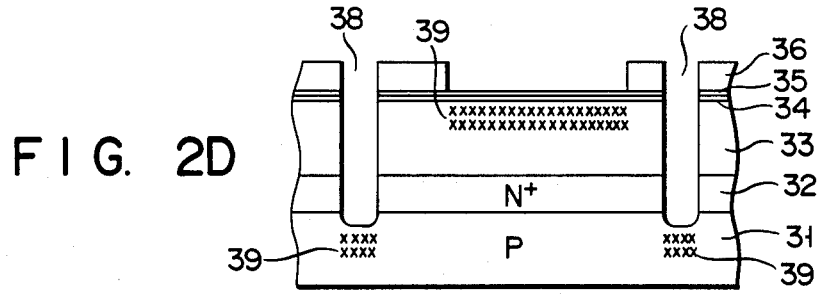
F I G. 2D
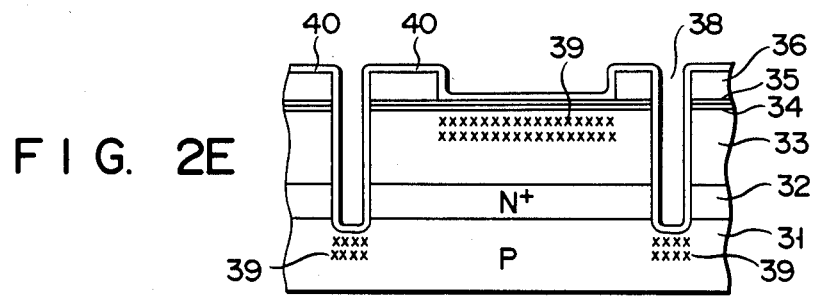
F I G. 2E
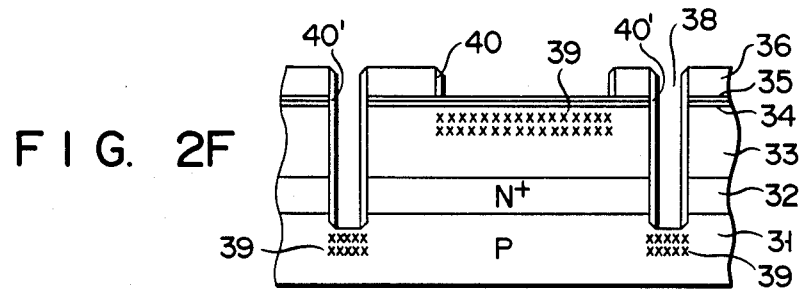
F I G. 2F

METHOD OF MANUFACTURING A SEMICONDUCTOR DEVICE WITH CONDUCTIVE TRENCH SIDEWALLS

BACKGROUND OF THE INVENTION (a) Field of the Invention

The present invention relates to a method of manufacturing a semiconductor device having a buried layer.

(b) Description of the Prior Art

In a conventional bipolar IC (Bipolar Integrated Circuit), an epitaxial layer is formed on a semiconductor substrate with a buried region, and part of the epitaxial layer is formed as an island region electrically isolated from the remaining portion thereof. A functional element is formed in the island region. A p-n junction isolation technique, an insulator isolation technique, or a combination thereof is used to form the island region. Along with widespread application of RIE (Reactive Ion Etching) technique, a trench isolation technique is frequently employed to decrease the size of semiconductor circuits.

A conventional example using the trench isolation technique will be described with reference to FIGS. 1A to 1D.

N+-type buried layer 12 is formed in p-type semiconductor substrate 11, and 5 μm thich epitaxial layer 13 is deposited thereon. A sectional view of the resultant structure is shown in FIG. 1A. Layer 12 has a thickness of 2 μm. Subsequently, 5000 Å thick thermal oxide film 14 is formed on an exposed surface of layer 12 and is then etched by photolithography as a specific location to form opening 15. An oxide layer containing a diffused impurity, e.g., PSG (phosphosilicate glass) layer 16 is deposited on film 14.

The resultant structure is annealed at a high temperature for a long period of time to form so-called deep n+-type region 17 (FIG. 1B). The impurity (e.g., phosphorus (P)) contained in layer 16 is diffused to a depth of, e.g., 2 μm in layer 12. Impurity ions also leak out from layer 12 and combine with the ions from layer 16 at a depth of 2 μm. Furthermore, the impurity is diffused along a direction parallel to the exposed surface for a distance corresponding to the diffusion depth in layer 12. Therefore, phosphorus ions contained in layer 16 are diffused in a 2 μm wide region around opening 15 to form an N+-type region. If opening 15 has an area of 1×5 μm², the combined n+-type region has an area of 5×9 μm².

Subsequently, film 14 and layer 16 are removed and another thermal oxide film 18 is formed on the exposed surface of layer 13. Blocking layer 19 is formed by RIE, and annular isolation trenches 20 are formed in layer 13 (FIG. 1C). Oxide film 21 is formed on the surfaces of trenches 20, and trenches 20 ar filled with insulating layer 22 of silicon dioxide or silicon nitride to prepare the so-called island regions. Functional elements are then formed in the island regions.

The trench isolation technique was developed to decrease the size of element isolation regions. When this technique is applied to a semiconductor device with a buried layer, the buried layer is electrically connected to a surface region of the epitaxial layer by means of the impurity. As a result, lateral impurity diffusion impairs the effectiveness of the technique.

In addition, the upper half of layer 13 is converted to an n+-type region by the impurity leaking from layer 12. Therefore, after extimating the thickness of the upper n+-type region of layer 13, its thickness must be increased accordingly, thus increasing fabrication cost.

Another conventional example adopting the trench isolation technique is described in U.S. Pat. No. 4,140,558 issued on Mar. 2, 1978. According to this example, an isolation trench for defining an island region is formed by two steps, and an electrical connection (formation of the connection region) between the buried layer and the epitaxial surface region is made by impurity diffusion from the wall surface of the isolation trench. In this case, the connection region is formed by impurity diffusion at a relatively high temperature, i.e., 1,000° to 1,050° C., so that the width of the connection region is inevitably incrased. Crystal defects occur in the epitaxial layer due to oxygen leakage, and leakage of the impurity from the buried layer also occurs.

SUMMARY OF THE INVENTION

It is an object of the present invention to provide a method of manufacturing a semiconductor device which eliminates the conventional drawbacks described above and which allows micropatterning of a connection region between a buried layer and the surface region of an epitaxial layer.

In order to achieve the above object of the present invention, there is provided a method of manufacturing a semiconductor device, comprising the steps of: forming a buried region in one major surface of a semiconductor substrate; forming an epitaxial layer on one major surface of the semiconductor substrate which includes the buried region; forming an annular trench extending through the buried region; depositing a conductive layer on only a side wall surface of the annular trench; filling the annular trench with an insulating material; and forming a functional element in the epitaxial layer surrounded by the buried region and the insulating material within the annular trench.

According to the present invention, the annular isolation trench is formed in the semiconductor substrate with a buried layer from the surface of the epitaxial layer deposited on the semiconductor substrate so as to extend through the buried layer. A conductive layer is formed only on the side wall surface of the trench. The trench is then filled with a filler. Therefore, impurity leakage from the buried layer can be prevented, and the thickness of the layer can be decreased, thus contributing to further miniaturization.

BRIEF DESCRIPTION OF THE DRAWINGS

FIGS. 2A to 2J are sectional views for explaining steps in the manufacture of a semiconductor device employing a trench isolation technique according to an embodiment of the present invention.

DETAILED DESCRIPTION OF THE PREFERRED EMBODIMENT

The present invention will be described with reference to an illustrated embodiment in conjunction with the accompanying drawings.

Figure 1A:
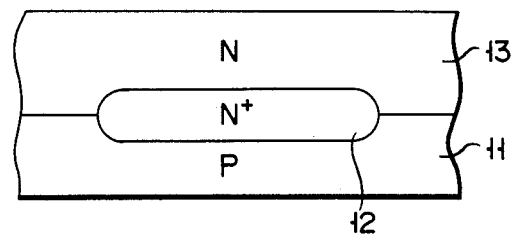
FIGS. 1A to 1D are sectional views for explaining steps in the manufacture of a semiconductor device employing a conventional trench isolation technique.
Figure 1B:
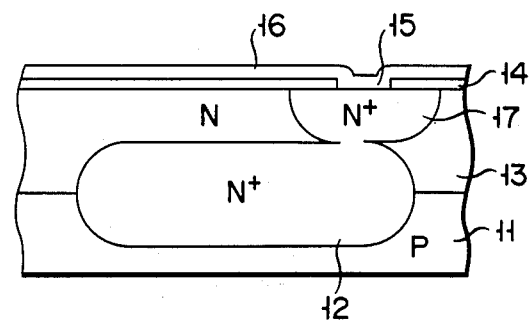
Figure 1C:
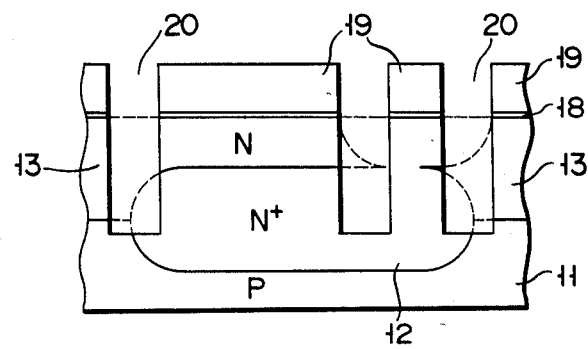
Figure 1D:
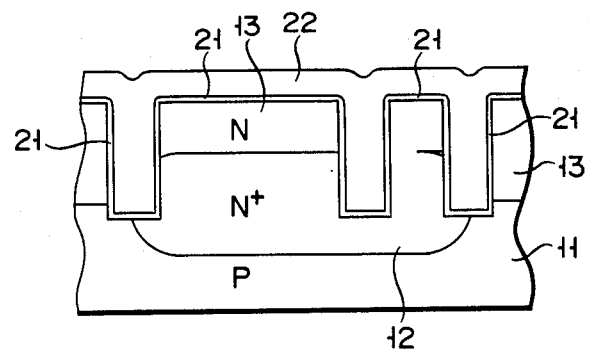
Figure 2A:
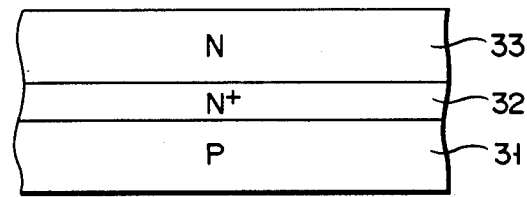
Figure 2B:
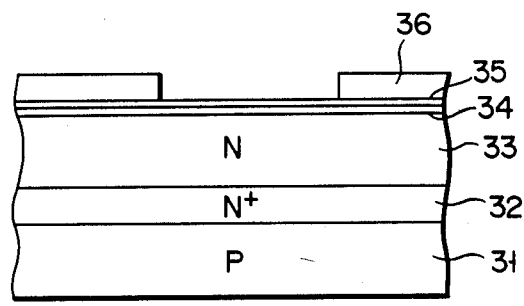

As shown in FIG. 2A, n+-type buried layer 32 is formed on part or whole of the surface of p-type semiconductor substrate 31, and 3 μm thick epitaxial layer 33 is deposited on layer 32. As shown in FIG. 2B, 0.05

μm thick thermal oxide film 34 and 0.1 μm thick silicon nitride film 35 are sequentially formed on the surface of layer 33. A 1.5 μm thick SiO$_2$ film is deposited on film 35 and is patterned to form blocking layer 36.

Figure 2C:
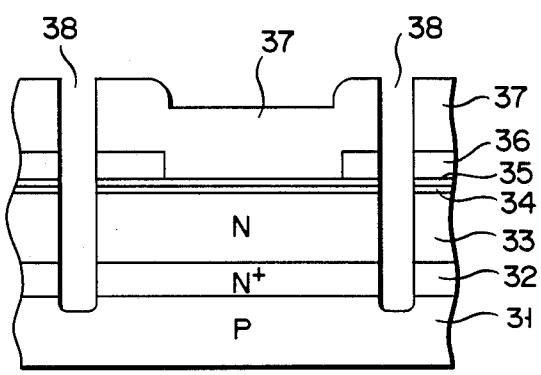

Al layer 37 is deposited on the resultant structure and is patterned to form an opening corresponding to a prospective trench formation region. Trench 38 is selectively etched by RIE using the remaining Al layer 37 as a mask so as to extend through layer 32 (FIG. 2C). layer 37 is removed, and p-type impurity ions 39, e.g., boron (B) ions are ion-implanted in the exposed portion of layer 33 and the bottom of trench 38 at an acceleration voltage of 50 keV and a dose of $1.5 \times 10^{14} cm^{-2}$ using layer 36 as a mask (FIG. 2D).

As shown in FIG. 2E, polysilicon layer 40, containing an n-type impurity, e.g., P or P+As, is deposited on the wall surface of trench 38, the surface of layer 36, and the exposed portion of layer 35 (FIG. 2E). Layer 40 can be deposited by CVD (Chemical Vapor Deposition) or PVD (Physical Vapor Deposition).

Layer 40 is etched by RIE from the bottom surface of trench 38, and the upper surface of film 35 and layer 36. Layer 40, deposited on the side wall surface of trench 38, is not removed, thereby constituting a conductive layer, i.e., connection region 40', which serves as a path for electrically connection the surface of layer 33 to layer 32 (FIG. 2F).

Figure 2G:
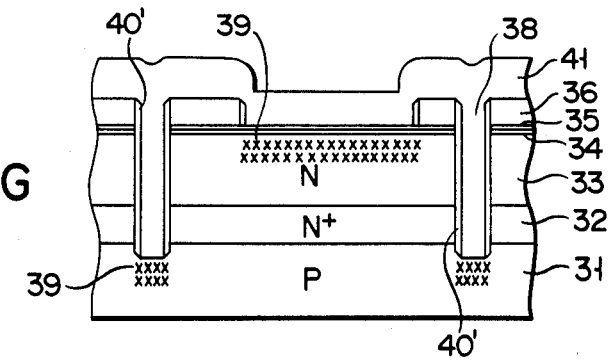

Silicon oxide 41 is then deposited by CVD to cover the entire surface of the resultant structure, so that trench 38 is completely filled therewith (FIG. 2G).

Figure 2H:
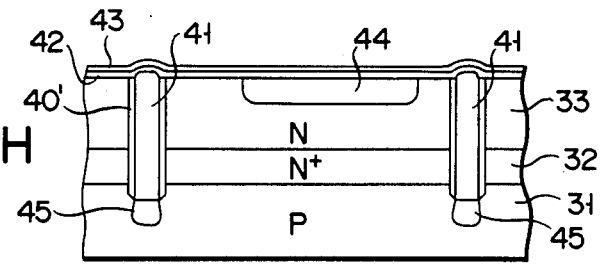

The excessive portion of silicon oxide 41 (the portion not contained in trench 38), layer 36, film 35, and then film 34 are sequentially etched to expose the upper surface of layer 33 and flatten the surface of the resultant structure, as shown in FIG. 2H.

Thermal oxide film 42 and silicon nitride film 43 are deposited on the flat surface. Annealing during deposition causes activation of doped boron ions 39 to form base region 44 of a transistor in layer 33 and channel stopper region 45 at the bottom of trench 38.

Figure 2I:
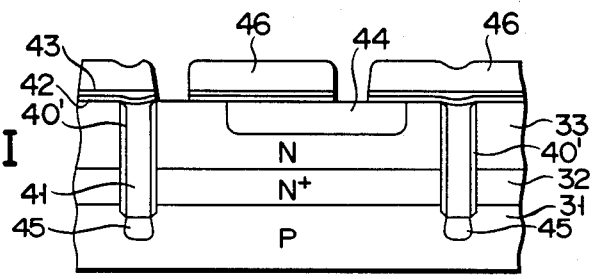
Figure 2J:
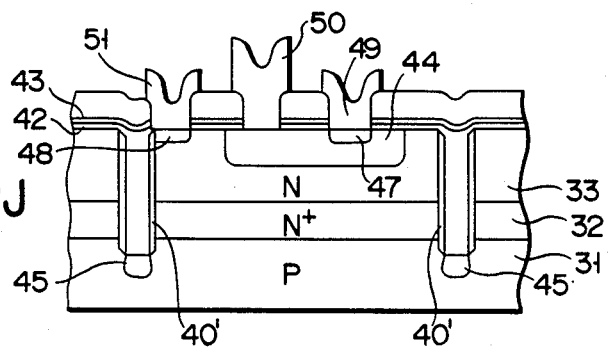

Insulating film 46, such as an SiO$_2$ film, is formed over the entire upper surface of film 43. Photolithography is performed to selectively etch or pattern films 43 and 43, thereby exposing part of region 44 and the part of layer 33 adjacent to trench 38 (FIG. 2I). A P- and As-doped polysilicon layer (not shown) is deposited to diffuse P and As in layer 33 through the exposed portions, thereby forming emitter and collector regions 47 and 48, respectively. Films 43 and 42 are selectively etched and a conductive substance such as Al is deposited and patterned to form a base electrode, thereby preparing a bipolar transistor with emitter, base and collector electrodes 49, 50 and 51, respectively.

According to the method of the present invention as described above, the element isolation deep trench extending through the buried layer can be formed in a single step. The conductive layer is formed on the side wall surface of the trench to electrically connect the buried layer to the element region on the surface of the epitaxial layer. Since the connection layer can be formed at the low temperature of 600° C. in a short period of time (⅓ the time required for the conventional diffusion technique). the thermal load acting on the semiconductor substrate is reduced along with degradation of the epitaxial layer, e.g., defects caused by oxygen leakage. Compared with the conventional impurity diffusion technique, the connection region has a low resistance and can be micropatterned. A margin of thickness of the epitaxial layer which is determined by estimating impurity leakage from the buried layer need not be considered.

According to the present invention, the functional element is surrounded by the buried layer and the conductive layer, and variations in potential profile can be prevented to improve electrical characteristics.

What is claimed is:

1. A method of manufacturing a semiconductor device, comprising the steps of:
   (a) forming a buried region doped with an impurity in a major surface of a semiconductor substrate;
   (b) forming a epitaxial layer on the major surface of said semiconductor substrate which includes said buried region;
   (c) forming an annular trench extending through said buried region;
   (d) depositing impurity-doped polysilicon on an inner surface of said annular trench, saidn impurity being of the same conductivity type as that of said buried region;
   (d') etching the impurity-doped polysilicon by reactive ion etching to leave as a conductive layer a portion of said impurity-doped polysilicon in direct contact with a side wall surface of said annular trench;
   (e) filling said annular trench with an insulating material; and
   (f) forming a functional element in said epitaxial layer surrounded by said buried region and said insulating material within said annular trench.

2. A method according to claim 1, wherein the step (c) comprises the step of forming an annular trench having a wall surface substantially perpendicular to said semiconductor substrate.

3. A method according to claim 1, wherein said impurity-doped polysilicon is deposited by chemical vapor deposition.

4. A method according to claim 1, wherein said impurity-doped polysilicon is deposited by physical vapor deposition.

5. A method according to claim 1, wherein said functional element formed in the step (f) is a bipolar semiconductor device.

* * * * *